(12) United States Patent
Ahmed et al.

(10) Patent No.: US 7,676,335 B2
(45) Date of Patent: Mar. 9, 2010

(54) METHOD FOR DETERMINING BATTERY CAPACITY

(75) Inventors: Farhad Ahmed, Ottawa (CA); Runbo Fu, Kanata (CA)

(73) Assignee: Research In Motion Limited, Waterloo (CA)

( * ) Notice: Subject to any disclaimer, the term of this patent is extended or adjusted under 35 U.S.C. 154(b) by 125 days.

(21) Appl. No.: 11/945,765

(22) Filed: Nov. 27, 2007

(65) Prior Publication Data

US 2008/0086277 A1    Apr. 10, 2008

Related U.S. Application Data

(63) Continuation of application No. 11/499,291, filed on Aug. 4, 2006, now Pat. No. 7,317,996, which is a continuation of application No. 10/982,461, filed on Nov. 5, 2004, now Pat. No. 7,107,161.

(51) Int. Cl.
*G01R 31/36* (2006.01)
(52) U.S. Cl. ........................................................ 702/63
(58) Field of Classification Search .................. 702/63, 702/64, 66, 69, 182–185, 188
See application file for complete search history.

(56) References Cited

U.S. PATENT DOCUMENTS

| 2001/0022518 A1* | 9/2001 | Asakura et al. .............. 324/426 |
| 2003/0008202 A1 | 1/2003 | Tran |
| 2004/0220758 A1 | 11/2004 | Barsoukov et al. |
| 2005/0001627 A1 | 1/2005 | Anbuky et al. |
| 2005/0029988 A1 | 2/2005 | Tran |
| 2005/0225301 A1 | 10/2005 | Arnold et al. |
| 2005/0269993 A1 | 12/2005 | Palanisamy et al. |
| 2006/0049805 A1 | 3/2006 | Tran |

FOREIGN PATENT DOCUMENTS

FR    2 518 757    6/1983

* cited by examiner

*Primary Examiner*—Edward Raymond
(74) *Attorney, Agent, or Firm*—Jones Day; Krishna K. Pathiyal; Robert C. Liang

(57) ABSTRACT

A method includes monitoring the voltage of a power source connector for charging a battery. A determination is made that the battery has entered a transition phase based on sensing an abrupt change in the voltage. In response to determining that the battery is in the transition phase, a capacity of the battery is determined based on a transition phase battery capacity model that defines the battery's capacity as a function of the battery's voltage.

23 Claims, 6 Drawing Sheets

METHOD FOR DETERMINING BATTERY CAPACITY

CROSS-REFERENCE TO RELATED APPLICATION

This is a continuation of U.S. patent application Ser. No. 11/499,291, filed Aug. 4, 2006 now U.S. Pat No. 7,317,996, which is a continuation of U.S. patent application Ser. No. 10/982,461, filed Nov. 5, 2004, now U.S. Pat. No. 7,107,161, both applications hereby incorporated herein by reference.

TECHNICAL FIELD

This application relates generally to batteries, and more particularly to reporting the capacity of a battery.

BACKGROUND

Many mobile computing and communicating devices rely upon standard battery cells for providing power on which to operate. Though disposable battery cells, such as alkaline cells, are a well-known and reliable technology, it is common in such mobile devices to employ rechargeable battery cells. These rechargeable batteries depend on a number of known cell types, including Ni-Cad, Ni-MH, and Li-Ion cells. All these cells are known to those of skill in the art, as are some of their deficiencies. One of the known deficiencies of the above mentioned rechargeable battery cells is related to the fact that each battery has a finite life span that can be measured in terms of recharge cycles. The process of charging and discharging the cell damages the cell's charge storage capabilities, causing the stored potential, which is typically measured in mA-hours, to decrease over the life of the battery. As the ability to store charge decreases, so does the battery's utility. The life of the battery can be drastically curtailed by improperly charging, or over discharging the battery. As a result of these deficiencies, it is crucial that a user be able to determine the capacity of a battery both prior to and during the usage.

A state of the art technique for battery capacity reporting relies on the coulomb counter. The principle of operation involved in coulomb counting is computing the difference between the coulombs injected into a battery and the coulombs taken out of the battery. The capacity of the battery is then reported by comparing the coulomb count relative to a reference coulomb count value that corresponds to maximum battery capacity. For instance, if the coulomb count of a battery is half of the reference value, the battery capacity is reported to be 50 percent. Although the coulomb counter addresses battery capacity reporting, it may have several problems. First, the reported capacity may not be meaningful if an accurate reference coulomb count value corresponding to maximum battery capacity is not known. Furthermore, with a coulomb counter it may be difficult to keep an accurate reference coulomb count, particularly when battery capacity decreases over the lifetime of the battery. Further still, with a coulomb counter it may be necessary to know the current battery capacity before beginning the coulomb count.

A limitation of the coulomb counting principle is that it may not be applicable to reporting the capacity of a battery of initially unknown battery capacity: if the capacity of a battery is to be reported using the coulomb count system and method, the battery may have to be taken from its unknown capacity state to either a fully charged 100% battery capacity state or to a fully discharged 0 percent capacity state before the coulomb count can be used. Because the state of the battery is unknown at a certain point, the only way to charge the battery to 100% capacity is to constantly provide charge over an extended length of time. This can result in an overcharging of the cell, which is known to damage the storage capability of the cell. Conversely, to guarantee that the cell is at 0% capacity, the cell must be completely discharged. Rechargeable batteries are possibly permanently damaged by being overly discharged.

Further practical limitations exist with coulomb counting techniques. In practice, coulomb counting works by applying integration over time. The presence of an offset in a coulomb counter may result in the inaccuracy of the coulomb count. This applies even to batteries with an assumed initially known battery capacity, and is compounded with every recharge cycle. This may be especially true if the battery needs to be used for a long period of time between opportunities to reset the coulomb counter. For instance, in a battery that needs to be used for 3 weeks between charges, even small offsets with each charge cycle may accumulate to become large inaccuracies in reported capacity.

Other known existing techniques of battery capacity reporting are primarily based on measuring battery voltage.

Batteries have known characteristic charge and discharge curves. FIG. 1 illustrates a charge curve model 130 and a discharge curve model 140 for a battery. These curves relate battery voltage 110 to capacity percentage 120 for a rechargeable battery. Battery capacity percentage 120 is related to battery voltage 110 in either a discharging state, shown by the discharge curve model 140, or the charging state shown by the charge curve model 130. Illustrated is a multiplicity of points such as point 132 on the charge curve model 130 and point 142 on the discharge curve. Interpolation can be used to provide capacity values 120 for voltages 110 that lie between points for which values are known. In reference to FIG. 1, the relationship between battery voltage 110, battery charge state and capacity 120 is illustrated by two curve models 130, 140. The first curve model 130 corresponds to a positive battery charge current or battery charging state, and the second curve model 140 corresponds to a negative battery charge current or battery discharging state.

When the battery is in a charging state, a charge curve corresponding to the charging state is utilized. When the battery is in a discharging state, a discharge curve corresponding to the discharging state is utilized. The charge and discharge curves are such that given a battery voltage value and a charge curve or a discharge curve, it is possible to obtain a corresponding capacity value from the curves.

Though it is possible to determine the capacity of a battery by measuring the voltage of the battery and examining the curves, it should be noted that the existence of two distinct curves presents a problem. For example, when a battery voltage is 3.8 V and a power source is plugged into the battery at this time, according to the discharge state curves, there is an abrupt drop of the reported battery capacity from 52% to 17%. The reported result is not correct. Actually, a battery enters a transition phase P1 from discharging to charging when a power source is plugged in while the battery is discharging. After the transition phase P1, the battery goes into the charging state. Similarly, when a power source is removed while charging a battery, for example, at a battery voltage 3.9V, there is an abrupt rise of the reported battery capacity from 49% to 71% based on the charging curve and the discharging curve of FIG. 1. Actually, a battery enters a transition phase P2 from charging to discharging when a power source is removed while charging the battery. After the transition phase P2, the battery goes into the discharging state. Under the above circumstances, the reported result will not be correct if the discharging curve and the charging curve of FIG. 1 are used to report the battery capacity in the transition phases.

SUMMARY

A method includes monitoring the voltage of a power source connector for charging a battery. A determination is made that the battery has entered a transition phase based on sensing an abrupt change in the voltage. In response to determining that the battery is in the transition phase, a capacity of the battery is determined based on a transition phase battery capacity model that defines the battery's capacity as a function of the battery's voltage.

Preferably, the determination step includes determining that the battery has entered a transition phase from discharging to charging based on sensing an abrupt increase in the connector voltage. The determination step includes determining that the battery has entered a transition phase from charging to discharging based on sensing an abrupt decrease in the connector voltage. The method further includes determining that the transition phase has ended based on the lapse of a predetermined time period from the start of the transition phase, or based on the battery's voltage having changed by a predetermined voltage value from the battery's voltage at the start of the transition phase. The method further includes determining the transition phase battery capacity model from both a non-transition battery capacity charge model and a non-transition battery capacity discharge model, all three models defining the battery's capacity as a function of the battery's voltage.

DETAILED DESCRIPTION

Generally, the present application provides a method and system for reporting battery capacity accurately by means of a battery capacity transition phase model when an event occurs. The event may be the attachment or disconnection of the battery to a battery charger or power source, the occurrence of a fault condition such as power failure to the battery charge when the battery is attached, or the like.

The battery capacity transition phase model may be described as a function or may be described through interpolation of values stored in a look up table or array.

An example method for reporting battery capacity reports the battery capacity based on a transition phase battery capacity model during a transition phase. A transition phase battery capacity model relevant to the transition phase from discharging to charging and a transition phase battery capacity model relevant to the transition phase from charging to discharging are predetermined. Once it is determined that the battery is in a transition state, a discharging state, or a charging state, then a transition phase battery capacity model curve, a discharge curve or a charge curve is selected respectively. A voltage of the battery is then read, and a battery capacity is determined by using the selected curve. The transition phase battery capacity model is preferably a function associated with battery voltage, discharge curve and charge curve. This function may be expressed as an equation, a set of equations, a look up table, or the like.

Alternatively, considering battery temperature effects, temperature compensations regarding a transition phase battery capacity model curve, a discharge curve and a charge curve may be performed to obtain accurate battery capacities under different temperatures.

Alternatively, a plurality of transition phase battery capacity model curves, discharge curves and charge curves corresponding to a plurality of battery operating temperatures or a plurality of battery operating temperature ranges may be provided, so that a corresponding curve for reporting battery capacity cab be selected based on a current battery operating temperature to obtain an accurate battery capacity.

Figure 2:
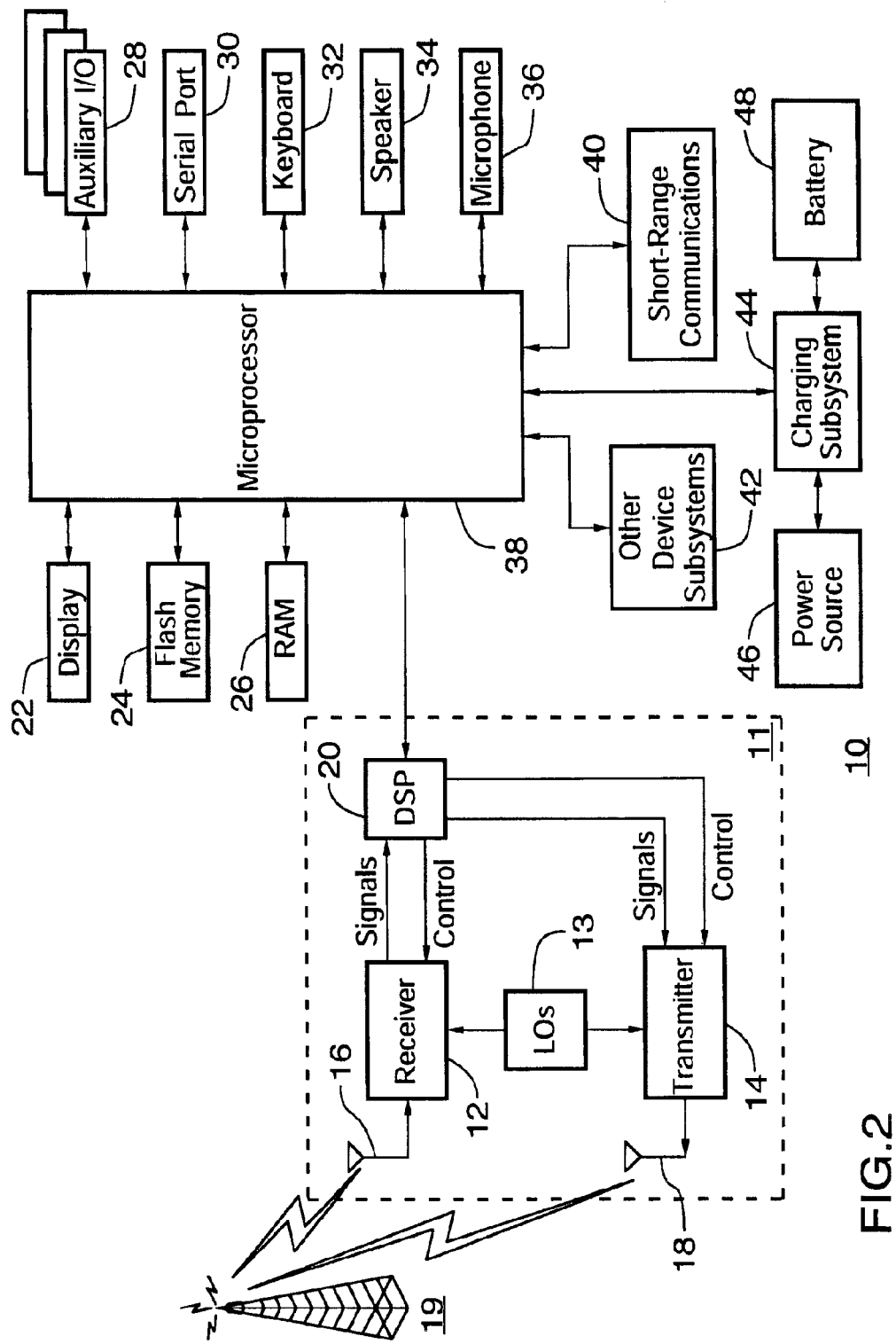
FIG. 2 is a block diagram of an example mobile communication device.

FIG. 2 is a block diagram of a mobile communication device 10 that may implement a system and method for accurately reporting battery capacity, as described herein. The mobile communication device 10 is preferably a two-way communication device having at least voice or data communication capabilities. The device preferably has the capability to communicate with other computer systems on the Internet. Depending on the functionality provided by the device, the device may be referred to as a data messaging device, a two-way pager, a cellular telephone, a wireless Internet appliance or a data communication device (with or without telephony capabilities). It should be understood, however, that battery capacity reporting and measurement may have applications other than in the field of mobile communicating and computing devices.

Where the device 10 is enabled for two-way communications, the device may incorporate a communication subsystem 11, including a receiver 12, a transmitter 14, and associated components such as one or more, preferably embedded or internal, antenna elements 16 and 18, local oscillators (LOs) 13, and a processing module such as a digital signal processor (DSP) 20. The particular design of the communication subsystem 11 is dependent upon the communication network in which the device is intended to operate. For example, a device 10 may include a communication subsystem 11 designed to operate within the Mobitex™ mobile communication system, DataTAC™ mobile communication system, General Packet Radio Service (GPRS) communication subsystem, CDMA communication system, and iDEN communication system.

Network access requirements may also vary depending upon the type of network 19. For example, in the Mobitex™ and DataTAC™ networks, mobile devices are registered on the network using a unique personal identification number or PIN associated with each device. In GPRS networks however, network access is associated with a subscriber or user of a device 10. A GPRS device therefore requires a subscriber identity module, commonly referred to as a SIM card, in order to operate on a GPRS network. Without a SIM, a GPRS device will not be fully functional. Local or non-network communication functions (if any) may be operable, but the device 10 may be unable to carry out functions involving communications over network 19. When required network registration or activation procedures have been completed, a device 10 may send and receive communication signals over the network 19. Signals received by the antenna 16 through a communication network 19 are input to the receiver 12, which may perform such common receiver functions as signal amplification, frequency down conversion, filtering, channel selection and analog-digital conversion. Analog to digital conversion of a received signal allows complex communication functions, such as demodulation and decoding, to be performed in the DSP 20. In a similar manner, signals to be transmitted are processed, including modulation and encoding for example, by the DSP 20 and input to the transmitter 14 for digital to analog conversion, frequency up conversion, filtering, amplification and transmission over the communication network 19 via the antenna 18.

The DSP 20 not only processes communication signals, but also provides for receiver and transmitter control. For example, the gains applied to communication signals in the receiver 12 and transmitter 14 may be adaptively controlled through automatic gain control algorithms implemented in the DSP 20.

The device 10 preferably includes a microprocessor 38 which controls the overall operation of the device. Communication functions, including at least one of data and voice communications, are performed through the communication subsystem 11. The microprocessor 38 also interacts with further device subsystems such as the display 22, flash memory 24, random access memory (RAM) 26, auxiliary input/output (I/O) subsystems 28, serial port 30, keyboard 32, speaker 34, microphone 36, a short-range communications subsystem 40 and any other device subsystems generally designated as 42.

Some of the subsystems shown in FIG. 2 perform communication-related functions, whereas other subsystems may provide "resident" or on-device functions. Some subsystems, such as keyboard 32 and display 22 for example, may be used for both communication-related functions, such as entering a text message for transmission over a communication network, and device-resident functions such as a calculator or task list.

Operating system software used by the microprocessor 38 may be stored in a persistent store such as flash memory 24, which may instead by a read only memory (ROM) or similar storage element. Discharge curves, charge curves and transition phase battery capacity models as discussed below may be pre-stored in memory 24. The operating system, specific device applications, or parts thereof, may be temporarily loaded into a volatile store such as RAM 26. Received communication signals may also be stored to RAM 26.

The microprocessor 38, in addition to its operating system functions, enables execution of software applications on the device. A predetermined set of applications which control basic device operations, including at least data and voice communication applications for example, will normally be installed on the device 10 during manufacture. One example application that may be loaded onto the device is a personal information manager (PIM) application having the ability to organize and manage data items relating to the device user such as, but not limited to e-mail, calendar events, voice mails, appointments, and task items. One or more memory stores may be available on the device to facilitate storage of PIM data items on the device. Such PIM application may have the ability to send and receive data items, via the wireless network. The PIM data items may be seamlessly integrated, synchronized and updated, via the wireless network, with the device user's corresponding data items stored or associated with a host computer system thereby creating a mirrored host computer on the mobile device with respect to the data items at least. This may be especially advantageous in the case where the host computer system is the mobile device user's office computer system. Further applications may also be loaded onto the device 10 through the network 19, an auxiliary I/O subsystem 28, serial port 30, short-range communications subsystem 40 or any other suitable subsystem 42, and installed by a user in the RAM 26 or a non-volatile store for execution by the microprocessor 38. Such flexibility in application installation increases the functionality of the device and may provide enhanced on-device functions, communication-related functions, or both. For example, secure communication applications may enable electronic commerce functions and other such financial transactions to be performed using the device 10.

In a data communication mode, a received signal such as a text message or web page download is processed by the communication subsystem 11 and input to the microprocessor 38, which may further process the received signal for output to the display 22, or alternatively to an auxiliary I/O device 28. A user of device 10 may also compose data items such as email messages for example, using the keyboard 32, which may be a complete alphanumeric keyboard or telephone-type keypad, in conjunction with the display 22 and possibly an auxiliary I/O device 28. Such composed items may then be transmitted over a communication network through the communication subsystem 11.

For voice communications, overall operation of the device 10 is substantially similar, except that received signals may be output to a speaker 34 and signals for transmission may be generated based on an input received through a microphone 36. Alternative voice or audio I/O subsystems such as a voice message recording subsystem may also be implemented on the device 10. Although voice or audio signal output may be accomplished primarily through the speaker 34, the display 22 may also be used to provide an indication of the identity of a calling party, the duration of a voice call, or other voice call related information for example.

The serial port 30 in FIG. 2 may be implemented in a personal digital assistant (PDA)-type communication device for which synchronization with a user's desktop computer may be desirable, the serial port 30 may enable a user to set preferences through an external device or software application and extend the capabilities of the device by providing for information or software downloads to the device 10 other than through a wireless communication network. The alternate download path may for example be used to load an encryption key onto the device through a direct and thus reliable and trusted connection to thereby enable secure device communication.

A short-range communications subsystem 40 may be included to provide for communication between the device 10 and different systems or devices, which need not necessarily be similar devices. For example, the subsystem 40 may include an infrared device and associated circuits and components or a Bluetooth™ communication module to provide for communication with similarly-enabled systems and devices.

A charging subsystem 44 may be included to provide power for the device 10 and different subsystems or devices. For example, the charging subsystem 44 may determine the presence of detachable power source device 46 and associated circuits, such as an AC adapter, USB cable, or car adapter to provide power for the device and to charge battery 48. Additionally, charging subsystem 44 may determine the absence of power source device 46, and consequently obtain power for the device 10 from battery 48. Generally speaking, when power source device 46 is disconnected to charging subsystem 44 and battery 48 powers device 10 alone, battery 48 is said to be in a discharging state. Conversely, when power source device 46 is connected to charging subsystem 44 and powers device 10, and charging subsystem 44 charges battery 48, battery 48 is said to be in a charging state. Actually, there is a transition phase from charging to discharging before battery 48 enters into a discharging state from a charging state, and a transition phase from discharging to charging before battery 48 enters into a charging state from a discharging state. The present application describes an example system and method for reporting the capacity of a battery, such as battery 48, during transition phases.

The battery capacity reported is a function of several factors, including battery voltage, battery charging current, and so on. The relationship between battery voltages, battery charging currents, and battery capacity is modeled using charge curves such as those illustrated in FIG. 1. Therefore, before describing embodiments of the method and system in detail, several concepts will be defined for greater certainty.

As used in this description and in the appended claims, the battery voltage is defined as the voltage differential between positive and negative terminals of the battery.

As used in this description and in the appended claims, battery charging current is defined as a current flowing into the battery. Battery charging current is capable of taking on a signed value, with a positive value meaning current being delivered into the battery and a negative value meaning current drawn out of the battery.

As used in this description and in the appended claims, a state of a battery is one of a charging state corresponding to a positive battery charging current value and a discharging state corresponding to a negative battery charging current value. A discharge curve model or a charge curve model is defined as the relationship between battery voltage, battery charging current and capacity so that given battery voltage and battery charging current, capacity can be determined by applying the capacity curve model.

When there is a change in the direction of a battery charging current or a change in the sign of a battery charging current value, for example, if the change is from delivering into a battery to drawing out of the battery or from a positive current value to a negative current value, it is determined that a battery enters a transition phase from a charging state; if the change is from drawing out of the battery to delivering into the battery or from a negative current value to a positive current value, it is determined that a battery enters a transition phase from a discharging state. Alternatively, as shown in FIG. 2, by monitoring a battery's power source connector, when there is an abrupt voltage change from 0V to a predetermined voltage value, it is determined that the battery 48 enters into a transition phase from discharging to charging. When there is an abrupt voltage change from the predetermined voltage value to 0V, it is determined that the battery 48 enters into a transition phase from charging to discharging. It should be understood that there are various methods to determine if a battery is in a transition phase or in a charging state or discharging state.

Figure 1:
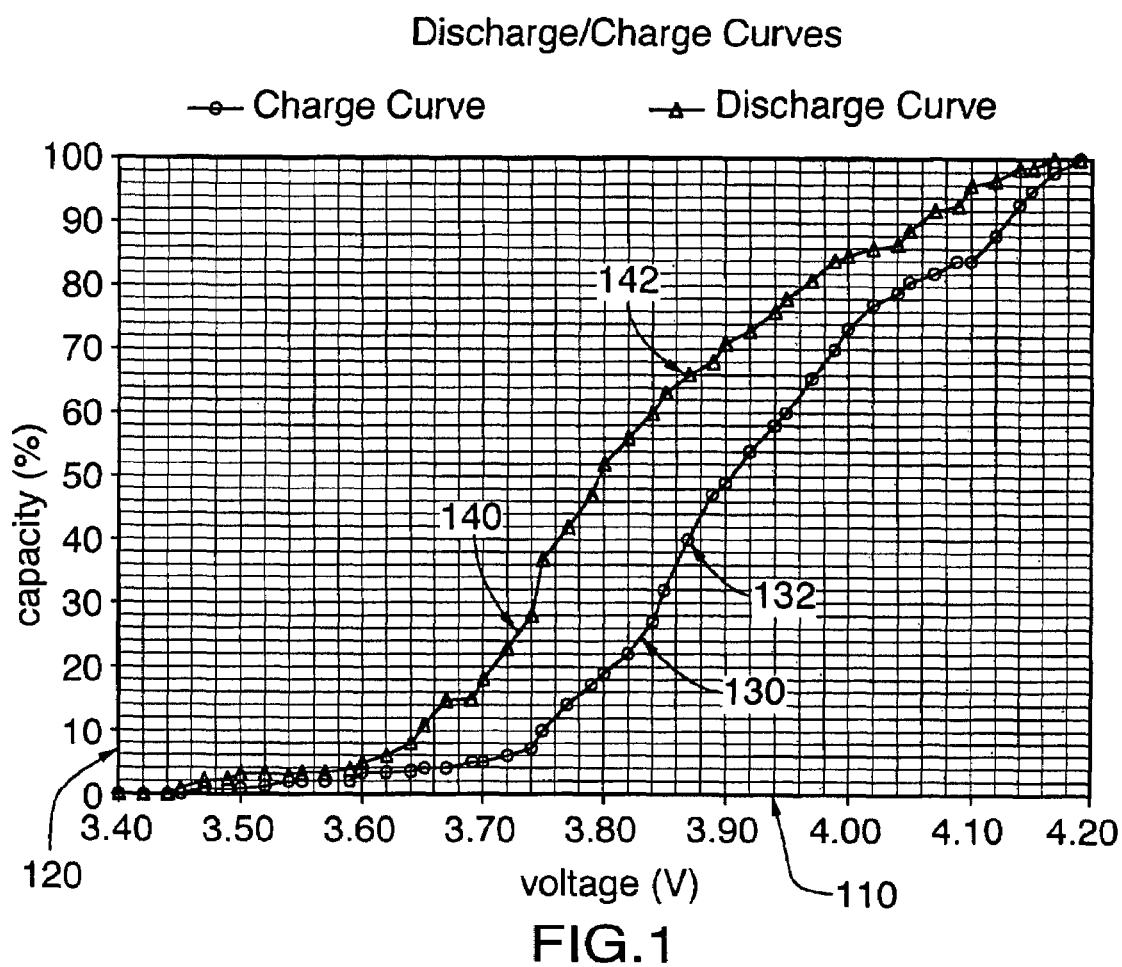
FIG. 1 illustrates two example curve models, a charge and a discharge curve model, relating battery voltage to capacity percentage for a rechargeable battery.

Referring to FIGS. 1 and 2, the example method may use a system, such as system 10 of FIG. 2, including a charging subsystem 44, to assist in determining values for the battery voltage 110 and battery capacity 120. The charging current can be used to determine the state and select either one of the curve models 130, 140. The charging subsystem 44 may be capable of performing several operations such as constant current charging operation and constant voltage charging operation.

Figure 3:
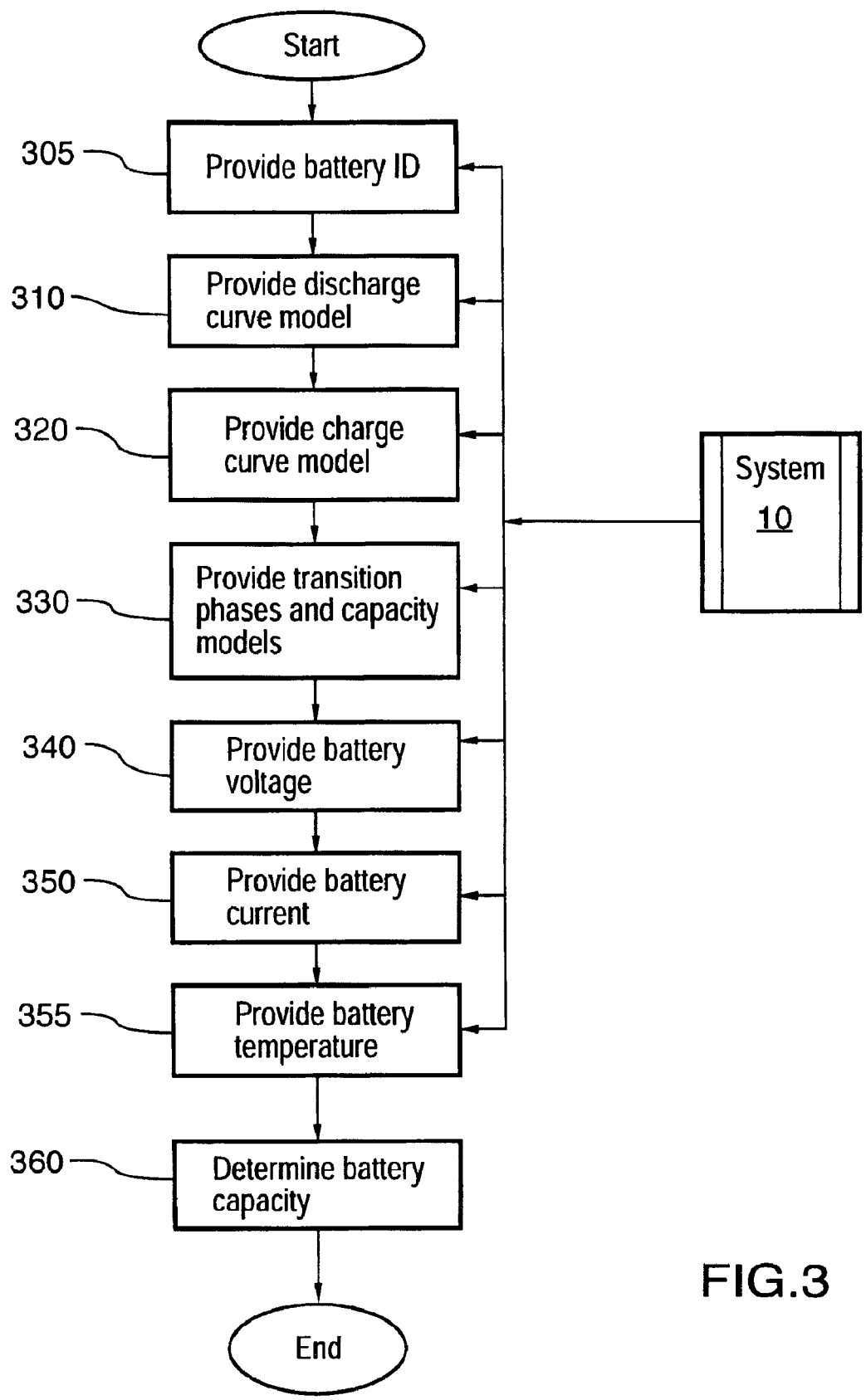
FIG. 3 illustrates an example method for reporting battery capacity.

FIG. 3 illustrates an example method for reporting battery capacity. At step 305, a battery identification (ID) is provided to identify the type of the battery. At step 310, a discharge curve model, such as 140, corresponding to the battery ID is provided. At step 320, a charge curve model, such as 130, corresponding to the battery ID is provided. At step 330, with respect to the battery ID, a transition phase battery capacity model F1 corresponding to a transition phase P1 from discharging to charging and a transition phase battery capacity model F2 corresponding to a transition phase P2 from charging to discharging are provided for reporting battery capacities during the transition phases P1 and P2. A transition phase P1 and a transition phase P2 are defined and provided. Models F1 and F2 may have a variety of forms from simple to complicated. More complicated models may more accurately report the capacity with less error at the expense of higher computational complexity. Models F1 and F2 may be of different or the same form.

Models F1 and F2 may be predetermined by experimentation. A transition phase P1 from discharging to charging and a transition phase P2 from charging to discharging are defined by means of a battery voltage change amount or by means of time change amount from the point where the charging or discharging state changes, that is, from the point when a battery is connected to a power source or a battery is disconnected from a power source. A transition phase is deemed to be over after a defined transition phase. For example, if a battery voltage change amount is used to define the transition phase, the voltage change amount may range from 0.05V to 0.3V. Similarly, if a time change amount is used to define the transition phase, the time change amount may range from 0.5 hours to 3 hours when the system is in a standby mode. Alternatively, if a battery capacity determined from a transition phase battery capacity model F1 corresponding to a transition phase from discharging to charging and a battery capacity determined from a charge curve model are same, the transition phase from discharging to charging is deemed to be over. Similarly, if a battery capacity determined from a transition phase battery capacity model F2 corresponding to a transition phase from charging to discharging and a battery capacity determined from a discharge curve model are same, the transition phase from charging to discharging is deemed to be over.

After the transition phase, a battery enters the charging state or the discharging state. The criterions of modeling capacity curves during the transition phase are to make them approach the actually measured capacity curves so as to minimize the capacity reporting error. The transition phase battery capacity model corresponding to the transition phase P1 and the transition battery capacity model corresponding to the transition phase P2 may be described by two functions. The transition phase battery capacity functions may be determined based on the discharge curve model 140 and the charge curve model 130 of FIG. 1, as described below with reference to FIG. 4.

At step 340, battery voltage is provided to determine battery capacity subsequently. At step 350, battery current is provided. By detecting a change in the direction or a change in sign of battery current value, it may be determined if the battery is in a transition phase, in a discharging state or in a charging state. At step 355, the battery temperature is measured. At step 360, the transition phase battery capacity model corresponding to the transition phase P1 or the transition phase battery capacity model corresponding to the transition phase P2 is applied to determine a battery capacity based on a battery voltage. Step 360 is described in detail below with reference to FIG. 6.

Figure 4:
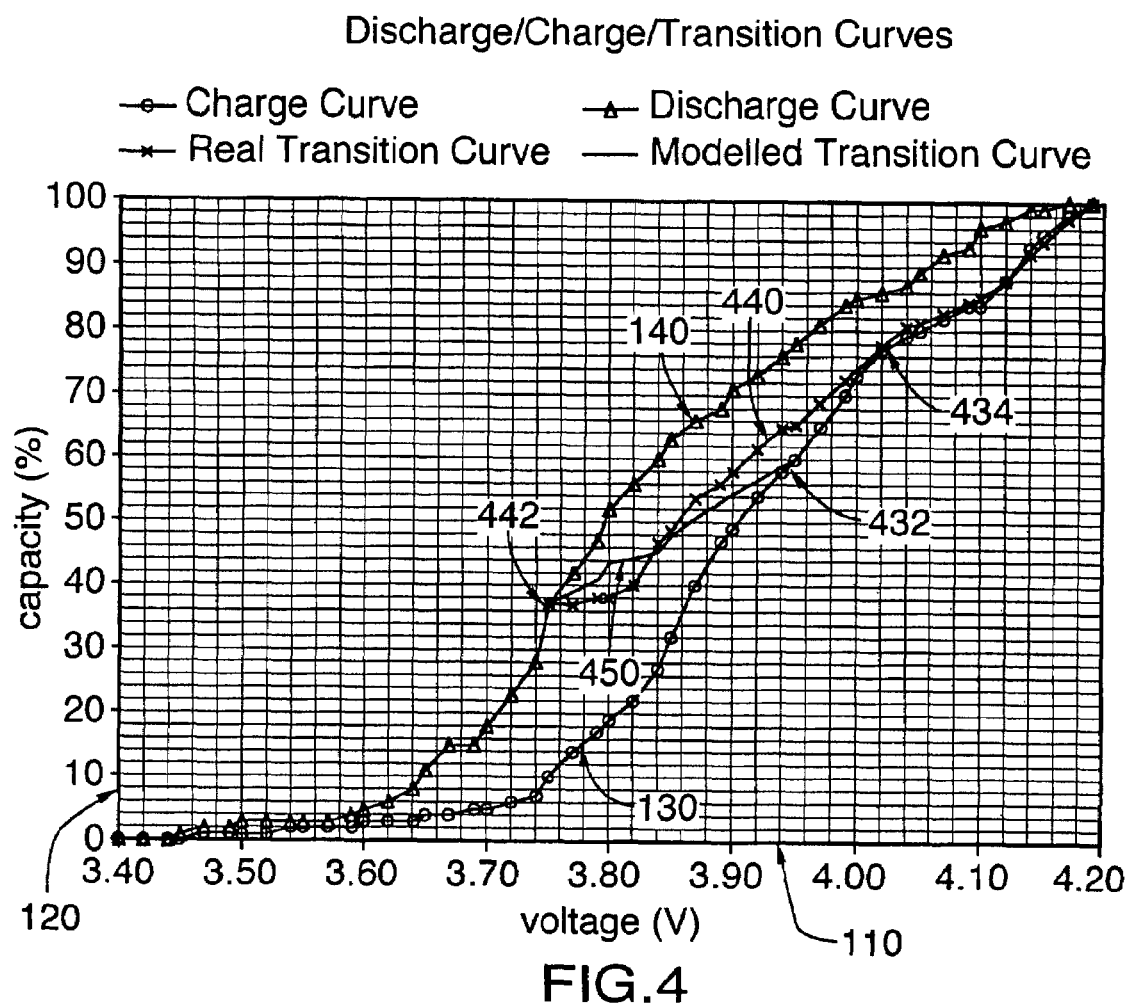
FIG. 4 illustrates an example of a transition battery capacity model curve for reporting a battery capacity in a transition phase from discharging to charging.

FIG. 4 illustrates an example transition battery capacity model curve for reporting a battery capacity in a transition phase from discharging to charging. In this example, the transition battery capacity model is described by a transition phase battery capacity function.

In FIG. 4, a battery 48 is assumed to be initially discharging 140 and at voltage 110 of 3.75V corresponding to point 442. Consequently, a 37% capacity is determined. Next, the battery enters the charging state, for instance if the power source 46 of FIG. 2 is connected while the battery is in use.

A battery that has been discharging and has a voltage reading of 3.75V can be determined to be 37% full by directly mapping from the initial discharge curve, corresponding to a discharging state. If a power source 46 is plugged in at this point, then the battery's capacity would erroneously be determined to be 10% full, according to the point where 3.75V maps on the new charging curve model 130 corresponding to a charging state. If that value were reported directly, then the user would see an incorrect capacity. Actually, the battery takes some time to reach to the charging curve model 130; that is, there is a transition phase P1 from discharging to charging. A measured relationship curve 440 between capacity and voltage during a transition phase PI from discharging to charging starts at point 442 corresponding to the discharging curve 140 and ends at point 434 corresponding to the charging curve model 130. A transition battery capacity function F1 corresponding to a transition phase P1 from discharging to charging is predetermined for reporting the battery capacity during the transition phase P1, and the determined function F1 curve 450 approaches the measured relationship curve 440. A transition phase battery capacity function F1 curve 450 starts at point 442 and ends at point 432. It can be seen from FIG. 4 that the curve 450 closely matches the behaviour of the measured relationship curve 440 such that any discrepancy in capacity is within 6%. Various transition phase battery capacity functions F1 may be used as long as the capacity reporting error is less than measured error 6%. More complicated functions may lead to more accurate battery capacity values and less capacity reporting error such as 2%, 1% or less. The following description concerns an example transition phase battery capacity function F1 based on a discharge curve and a charge curve.

In order to create a transition phase capacity function F1 corresponding to a transition phase P1 from a discharging state to a charging state, a real transition phase curve is determined through measurement, and then a function with a curve approaching the real transition phase curve is determined as a function F1 for a transition phase P1 from a discharging state to a charging state. Model F1 may be varied with different complexity. More complicated models may more accurately report the capacity with less error at the expense of higher computational complexity.

A transition phase battery capacity function F1 corresponding to a transition phase P1 from a discharging state to a charging state may be formulated as:

$$F1(V)=(1-a)\times F_{discharge}(V)+a\times F_{charge}(V), \text{ where } a=(V-V_{start})/\Delta V, \text{ wherein}$$

V is a voltage value 110 during the transition phase P1, and $\Delta V$ defines the transition phase P1 which is a battery voltage change amount between an end voltage and a start voltage in the transition phase P1; that is, $\Delta V=V_{end}-V_{start}$, wherein $V_{start}$ is the battery voltage at the start of the transition phase P1 and $V_{end}$ is the battery voltage at the end of the transition phase P1. In this example, $\Delta V$ is a constant, for example, $\Delta V=0.2$ Volts.

$F_{discharge}(V)$ corresponds to the discharge curve model 140. It is a function of battery voltage and provides a battery capacity corresponding to a battery voltage.

$F_{charge}(V)$ corresponds to the charge curve model 130 as a function of battery voltage and provides a battery capacity corresponding to a battery voltage. According to the transition phase battery capacity function F1, the battery capacity corresponding to the transition phase P1 can be calculated. As shown in FIG. 4, the capacity reporting error is almost within 6% capacity.

Figure 5:
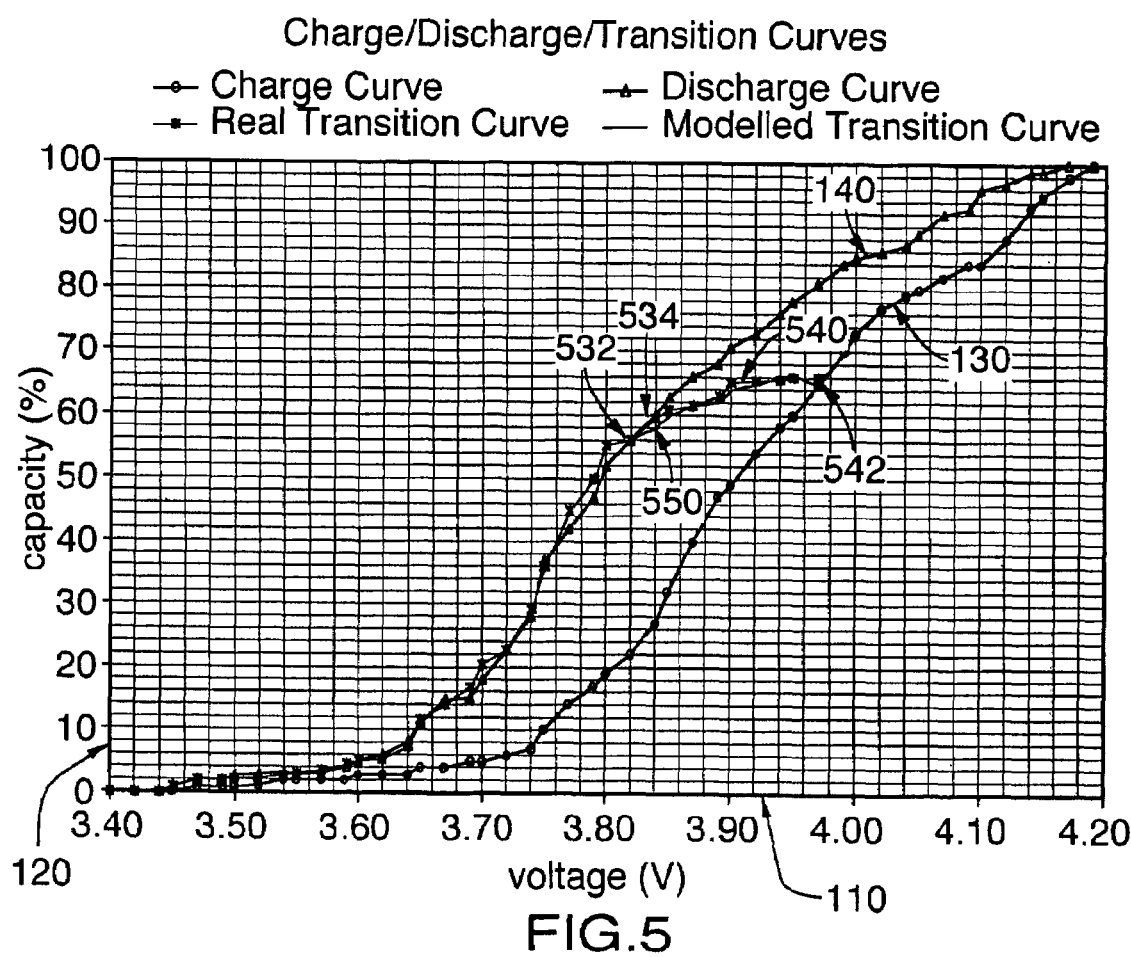
FIG. 5 illustrates an example of a transition battery capacity model curve for reporting a battery capacity in a transition phase from charging to discharging.

FIG. 5 illustrates an example of a transition battery capacity model for reporting a battery capacity in a transition phase from charging state to discharging state. In this example, the transition battery capacity model is described by a transition battery capacity function.

In FIG. 5, a battery 48 is assumed to be charged following curve 130 to voltage of 3.97V corresponding to point 542. Consequently, a 65% capacity is determined. Next, once the power source is removed, the battery enters the discharging state, for instance, if a power source 46 of FIG. 2 is disconnected while it is charging the battery 48.

The battery that has been charging with a voltage reading of 3.97V may be determined to be 65% full by directly mapping using charging curve 130. If the power source 46 is removed at this point, then the battery's capacity may erroneously be determined to be 81% full, according to where 3.97V maps on the discharge curve model 140 corresponding to a discharging state. If that value was reported directly, then the user would see an incorrect capacity, the battery capacity jumps while the power source is removed. Actually, the battery takes some time to reach the discharge curve model 140; that is, there is a transition phase P2 from the charging state to the discharging state. A measured capacity curve 540 during a transition phase P2 starts at point 542 on the charging curve model 130 and ends at point 534 on the discharging curve model 140. A transition battery capacity function F2 corresponding to the transition phase P2 from the charging to discharging is determined to report the battery capacity in the transition phase P2 and approaches the measured curve 540. The determined function F2 curve 550 is used to report a battery capacity and corresponds to an example transition battery capacity function F2 curve that starts at point 542 and ends at point 532. It can be seen from FIG. 5 that the function curve 550 is very close to the measured curve 540. In fact, the capacity discrepancy error may fall within 2%. Various transition battery capacity functions F2 may be provided such that the capacity reporting error may be less than measured 2%. More complicated functions may more accurately report the capacity at the expense of higher computational complexity. The capacity error may be minimized with a complex transition phase battery capacity function F2. To create a function F2 corresponding to the transition phase P2 from the charging state to the discharging state, a real transition phase curve is determined through measurement, then a function closely mimicking the behavior of the real transition phase curve is determined as the function F2 in the transition phase P2. A plurality of transition phase battery capacity functions F2 may be determined and used to report battery capacity.

In one example, $$F2(V)=(F_{discharge}(V)\times SQRT((V_{start}-V)/\Delta V)+F_{charge}(V)\times(1-SQRT((V_{start}-V)/\Delta V)),$$

where V is the battery voltage 110 during the transition phase P2 from the charging state to the discharging state.

$F_{discharge}(V)$ corresponds to the discharge curve model 140. It is a function of voltage V. It provides the battery capacity corresponding to the battery voltage.

$F_{charge}(V)$ corresponds to the charging curve model 130. It is the function of voltage V, and it provides the battery capacity corresponding to the battery voltage.

$\Delta V = V_{start} - V_{end}$, wherein $\Delta V$ defines the transition phase P2 which is a battery voltage change amount between a start voltage and an end voltage in the transition phase P2; $V_{start}$ is the battery voltage at the start of the transition phase P2, and $V_{end}$ is the battery voltage at the end of the transition phase P2. In this example, $\Delta V$ is a constant, for example, $\Delta V = 0.15V$.

Based on the transition phase battery capacity function F2, the battery capacity corresponding to the transition phase P2 can be calculated. As shown in FIG. 5, the capacity reporting error is within 2%. The capacity reporting error may be greatly reduced to less than 2% if other functions are used.

The transition phase battery capacity functions described provide examples for the purpose of illustration. It should be understood, however, that many linear or non-linear functions can be used. If more complicated functions were used, then the capacity reporting would be more accurate. The transition phase battery capacity function may be a function of several factors, including battery voltage, battery charge curve, and battery discharge curve. It also could be a function of time. When a transition phase is defined by a time change amount, the transition phase battery capacity may be a function of time, charging curve and discharging curve.

In one example, a plurality of charge curve models, discharge curve models and transition phase battery capacity models, each having a unique battery ID, are provided. A charge curve model, a discharge curve model or a transition phase battery capacity model is selected for determining battery capacity based on a battery ID.

In another example, a plurality of charge curve models 130, discharge curve models 140 and transition phase battery capacity models wherein each of the models relates to a battery ID and a battery operating temperature or a temperature range are provided. For example, models may be provided for battery operating temperatures such as $-20°$ C., $-15°$ C., $-5°$ C., $5°$ C., $15°$ C., $25°$ C., $35°$ C., $45°$ C. and/or $50°$ C. or battery operating temperature ranges of $-20°$ C. to $-10°$ C., $-10°$ C. to $0°$ C., $0°$ C. to $10°$ C., $10°$ C. to $20°$ C., $20°$ C. to $30°$ C., $30°$ C. to $40°$ C. and/or $40°$ C. to $50°$ C. A temperature range such as from $-20°$ C. to $50°$ C. may be divided into intervals. For example, an interval size of $5°$ C. or less may be used. Alternatively, the temperature range may be divided unevenly. A charge curve model, a discharge curve model or a transition phase model corresponding to a temperature closest to the current battery operating temperature is selected and used to report battery capacity. Alternatively, a charge curve model, a discharge curve model or a transition phase battery capacity model corresponding to a temperature range such as $20°$ C. to $30°$ C. containing a current battery operating temperature such as $24°$ C. may be selected and used to report battery capacity.

The transition phase battery capacity models described above may be linear or non-linear functions.

In a further example, instead of providing a plurality of models as above, a discharge model, a charge model, a transition phase model from charging to discharging, and a transition phase model from discharging to charging corresponding to a reference temperature or a reference temperature range may be provided and set as reference models. The reference temperature may be a particular temperature such as $22°$ C., and the reference temperature range may be a particular temperature range such as $20°$ C. to $25°$ C. A plurality of battery capacity offsets, wherein each corresponds to a battery ID and a temperature range or a temperature, are predetermined for compensating determined battery capacities. If a current battery operating temperature is a reference temperature or within a reference temperature range, no temperature compensation is required; that is, a zero battery capacity offset is applied. Otherwise, a corresponding temperature offset is applied to a battery capacity reported from a reference model. For example, when a battery operating temperature is $30°$ C., a battery capacity offset 1% is applied to a battery capacity obtained from a reference model corresponding to a reference range such as $20°$ C. to $25°$ C.

Figure 6:
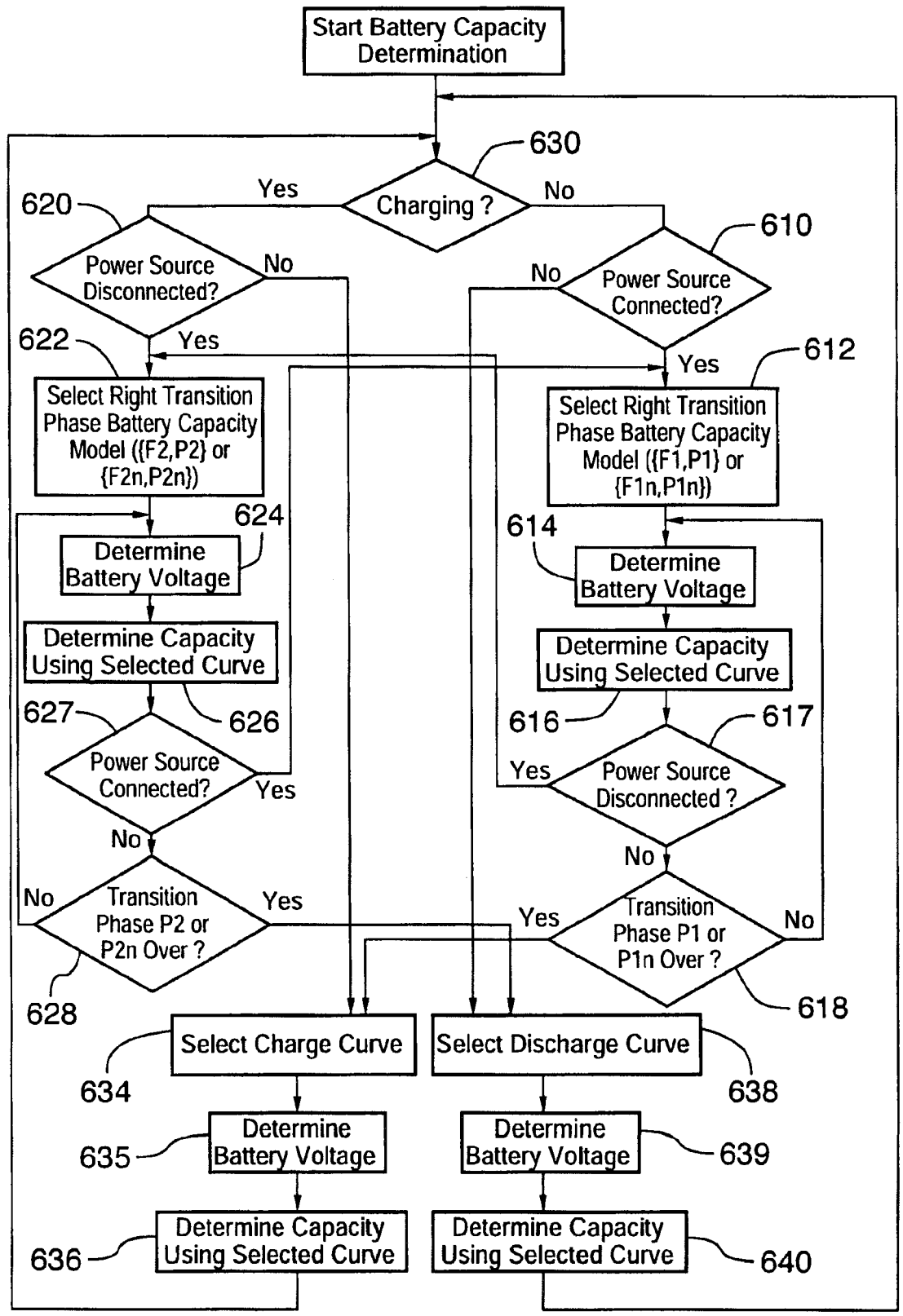
FIG. 6 is a flowchart illustrating an example method to carry out step 360 of FIG. 3 according to the transition battery capacity models of FIGS. 4 and 5.

FIG. 6 is a flowchart illustrating an example method to carry out step 360 of FIG. 3, according to the transition battery capacity functions of FIGS. 4 and 5.

At step 630, a determination is made as to whether the battery is charging or discharging. For instance, if a battery charging current is determined, the state can be derived from the sign of the charging current. At step 630, if it is determined that the battery is being charged, the process continues to step 620. At step 620, the charging subsystem 44 determines if the power source 46 is removed while charging the battery 48, for example, by checking a change in the direction or sign of battery current. It should be understood that a variety of methods may be implemented for determining if the battery enters a transition phase. If the power source 46 is removed, the battery 48 enters a transition phase P2 from charging to discharging, and then at step 622 a transition phase battery capacity model F2 corresponding to the transition phase P2, which provides a minimized battery capacity error, is selected, for example, according to a battery ID. Alternatively, a different transition phase battery capacity model F2 may be selected according to the requirements of capacity reporting error and computational complexity. At step 624, a battery voltage is read, and the process proceeds to step 626. At step 626, according to the selected battery capacity model F2 at step 622 and the obtained battery voltage at step 624, a battery capacity is determined, for example, by calculating the selected battery capacity model or by looking up a table corresponding to the selected battery capacity model. A plurality of tables, wherein each table corresponds to a transition phase battery capacity model, may be predetermined and pre-stored in memory 24. At step 627, it is determined if the power source 46 is connected. If yes, the battery enters into another transition phase and the process goes to step 612 and proceeds to the subsequent steps. If no, the process proceeds to step 628 where a determination is made to see if the transition phase P2 is over. For example, if a battery voltage change amount such as 0.2V is used to define the transition phase, it is determined that the transition phase is over when battery voltage is changed by the battery voltage change amount such as 0.2V from the start of the transition phase. If a time change amount such as 0.5 hours is used to define the transition phase, it is determined that the transition phase is over when time is changed by the time change amount such as 0.5 hours from the start of the transition phase. If the transition phase P2 is not over, the process returns to step 624 to read the next voltage for determining the next battery capacity.

If the transition phase P2 is over, then step 638 is taken where a discharge curve model 140 is selected, and a battery voltage is read at step 639. At step 640, a battery capacity is determined by examining the discharge curve model, for example by looking up a pre-stored table corresponding to the discharge curve model. If the power source 46 is not disconnected while the battery is charging at step 620, the battery 48 is not in a transition phase, then the process continues to step 634 where a charge curve model is selected, and a battery voltage is read 635. At step 636, the charge curve model is applied to determine the battery capacity based on the read battery voltage, and then the process returns to step 630 to determine next battery capacity.

At step 630, if it is determined that the battery is not being charged, the process continues to step 610. At step 610, it is determined by the charging subsystem 44 if power source 46 is connected to a battery 48 while the battery 48 is discharging. For example, by checking the change in the direction or sign of battery current, the charging subsystem 44 may determine if the power source 46 is connected. It should be understood that various methods of determining if the battery enters a charging state. If the answer is yes at step 610, the battery 48 enters a transition phase P1 from discharging to charging, and the process proceeds to step 612. At step 612, a transition phase battery capacity function F1 corresponding to the transition phase P1, which provides a minimized battery capacity error, is selected, for example, according to a battery ID. Alternatively, according to the requirements of capacity reporting error and computational complexity, a different transition phase battery capacity function F1 may be selected.

At step 614, a battery voltage value is read and the process proceeds to step 616. At step 616, according to the selected battery capacity model F2 at step 612 and the battery voltage at step 614, a battery capacity is determined, for example, by calculating the selected battery capacity model or by looking up a table corresponding to the selected battery capacity model. A plurality of tables, wherein each table corresponds to a transition phase battery capacity model, may be predetermined and pre-stored in memory 24. At step 617, it is determined if the power source 46 is disconnected. If yes, the battery enters into another transition phase and the process goes to step 622 and proceeds to the subsequent steps. If no, the process proceeds to step 618. At step 618, it is determined if the transition phase P1 is over. If it is not over, the process returns to step 614 where the next battery voltage is obtained for determining the most recent battery capacity.

If the transition phase P1 is over, then step 634 is taken where a charge curve model 130 is selected, and a battery voltage is read 635. At step 636, a battery capacity is determined by examining the charge curve model, for example by looking up a pre-stored table corresponding to the charge curve model, and then the process goes to step 630 to determine the next battery capacity Conversely, if at step 610, it is determined that the power source 46 is not connected to the battery 48 while the battery 48 is discharging, the process goes to step 638 where a discharge curve model is selected. At step 639, a battery voltage is read. At step 640, a discharging curve model is used to look up a battery capacity based on the read battery voltage, and then the process returns to step 630 to determine the next battery capacity.

Discharge curve models, charge curve models and transition phase battery capacity models for determining battery capacity as above may be pre-stored in memory 24 as lookup tables correlating battery voltage, battery state and battery capacity. By looking up a table according to a battery voltage and a battery state, a battery capacity may be determined.

Alternatively, the charging curve, discharging curve and transition phase models may be calculated on the fly by microprocessor 38 using code stored in memory 24.

In another example, a plurality of transition phase battery capacity models wherein each of models corresponds to a predetermined temperature range is provided so as to minimize battery capacity error. At step 612, according to a current battery operating temperature, a transition phase battery capacity model F1 corresponding to the transition phase P1 is selected from a plurality of transition phase battery capacity models by determining that the current battery operating temperature falls into a predetermined temperature range. A similar process as above is used in steps 622, 634, and 638.

In a further example, a plurality of transition phase battery capacity models, each corresponding to a predetermined battery operating temperature, are provided to more exactly report battery capacity. At step 612, according to a current battery operating temperature, a transition phase battery capacity model F1 corresponding to the transition phase P1 is selected from a plurality of transition phase battery capacity models by determining that the current battery operating temperature closest to a predetermined temperature. The selected transition phase battery capacity model has the predetermined temperature closest to the current battery operating temperature. A similar process as above is used in steps 622, 634, and 638.

In a further example, a plurality of the battery capacity offsets wherein each of them corresponds to a battery operating temperature range is provided. According to a current battery operating temperature, the calculated battery capacity is compensated based on a battery capacity offset immediately after step 616, by determining if the current battery operating temperature falls into a predetermined temperature range having a battery capacity offset. Similarly, immediately after steps 626, 636 and 640, a similar process as above is applied.

In a further example, a plurality of the battery capacity offsets, each of them corresponding to a battery operating temperature, is provided. According to a current battery operating temperature, the calculated battery capacity is compensated based on a battery capacity offset immediately after step 616 by determining if the current battery operating temperature is a predetermined temperature having a battery capacity offset or the current battery operating temperature is closet to a predetermined temperature having a battery capacity offset. Similarly, immediately after steps 626, 636 and 640, a similar process as above is applied.

When a battery is in the transition phase from discharging to charging P1 or the transition phase from charging to discharging P2, the battery could enter another transition phase if the battery charging state is changed again. For example, when the battery is connected to a power source while discharging, it enters into the transition phase from discharging to charging P1. If the battery is disconnected from the power source during the transition phase P1, the battery enters into a third transition phase $P_{11}$. A third transition phase model $F_{11}$ may be used to determine a battery capacity. Similarly, when a battery is disconnected from a power source while charging, it enters into the transition phase from charging to discharging P2. If the battery is connected to the power source during the transition phase P2, the battery enters into a fourth transition phase $P_{21}$. A fourth transition phase model $F_{21}$ may be used to determine the battery capacity. $F_{11}$ and F1 may be the same function. Similarly, $F_{21}$ and F2 may be the same function.

The above method may be implemented as an embodiment of charging subsystem 44. The system may include a transition phase determining circuitry operatively connected to the battery for determining if the battery is in a transition phase and battery capacity determining circuitry operatively connected to transition phase determining circuitry for determining the battery capacity based on a transition phase battery capacity model where the battery is in the transition phase. The system further comprises battery ID determining circuitry operatively connected to the battery for determining the battery ID, circuitry for selecting a transition phase battery capacity model from a plurality of transition phase battery capacity models based on the battery ID, and voltage reading circuitry operatively connected to the battery for determining a battery voltage. The system further comprises state determining circuitry operatively connected to the battery for determining a state of the battery where the battery is not in the transition phase. The battery capacity determining circuitry determines the battery capacity by examining a state curve model correlating voltage, state and capacity based on the determined charge state. The state includes a charging state and a discharging state. The state curve model includes a charge state curve model corresponding to a charging state and a discharge state curve model corresponding to a discharging state.

This written description uses examples to disclose the invention, including the best mode, and also to enable a person skilled in the art to make and use the invention. The patentable scope of the invention may include other examples that occur to those skilled in the art.

The invention claimed is:

1. A method comprising:
   monitoring the voltage of a power source connector for charging a battery;
   determining that the battery has entered a transition phase based on sensing an abrupt change in the voltage; and
   in response to determining that the battery is in the transition phase, determining a capacity of the battery based on a transition phase battery capacity model that defines the battery's capacity as a function of the battery's voltage;
   the transition phase occurring upon connection of the battery to a power source or disconnection of the battery from a power source, in which the battery's capacity as a function of voltage differs from both a charge curve and a discharge curve of the battery.

2. The method of claim 1 wherein the determination step includes determining that the battery has entered a transition phase from discharging to charging based on sensing an abrupt increase in the connector voltage.

3. The method of claim 1 wherein the determination step includes determining that the battery has entered a transition phase from charging to discharging based on sensing an abrupt decrease in the connector voltage.

4. The method of claim 1 wherein the abrupt change is from 0V to a predetermined voltage value or from a predetermined voltage value to 0V.

5. The method of claim 1 further comprising:
   determining that the transition phase has ended based on the lapse of a predetermined time period from the start of the transition phase.

6. The method of claim 1 further comprising:
   determining that the transition phase has ended based on the battery's voltage having changed by a predetermined voltage value from the battery's voltage at the start of the transition phase.

7. The method of claim 1 further comprising:
   determining the transition phase battery capacity model from both a non-transition battery capacity charge model and a non-transition battery capacity discharge model, all three models defining the battery's capacity as a function of the battery's voltage.

8. A handheld device configured to perform the method of claim 1.

9. A method comprising:
   determining that a battery has entered a transition phase initiated by a change in direction of current through the battery;
   in response to determining that the battery is in the transition phase, determining a capacity of the battery based on a transition phase battery capacity model that defines the battery's capacity as a function of the battery's voltage; and
   determining that the transition phase has ended based on the lapse of a predetermined time period from the start of the transition phase;
   the transition phase occurring upon connection of the battery to a power source or disconnection of the battery from a power source, in which the battery's capacity as a function of voltage differs from both a charge curve and a discharge curve of the battery.

10. The method of claim 9 further comprising:
    in response to determining the end of the transition phase, ceasing to base the capacity determination on the transition phase battery capacity model.

11. The method of claim 9 further comprising:
    in response to determining the end of the transition phase, determining the battery capacity based on a non-transition phase battery capacity model.

12. A handheld device configured to perform the method of claim 9.

13. A method comprising:
    determining that a battery has entered a transition phase initiated by a change in direction of current through the battery;
    in response to determining that the battery is in the transition phase, determining a capacity of the battery based on a transition phase battery capacity model that defines the battery's capacity as a function of the battery's voltage; and
    determining that the transition phase has ended based on the battery voltage having changed by a predetermined voltage value from the battery voltage at the start of the transition phase;
    the transition phase occurring upon connection of the battery to a power source or disconnection of the battery from a power source, in which the battery's capacity as a function of voltage differs from both a charge curve and a discharge curve of the battery.

14. The method of claim 13 further comprising:
    in response to determining the end of the transition phase, ceasing to base the capacity determination on the transition phase battery capacity model.

15. The method of claim 13 further comprising:
    in response to determining the end of the transition phase, determining the battery capacity based on a non-transition phase battery capacity model.

16. A handheld device configured to perform the method of claim 13.

17. A method comprising:
    determining a transition phase battery capacity model as a function of both a non-transition battery capacity charge model and a non-transition battery capacity discharge model, all three models defining a battery's capacity as a function of its voltage;
    the transition phase occurring upon connection of the battery to a power source or disconnection of the battery from a power source, in which the battery's capacity as a function of voltage differs from both a charge curve and a discharge curve of the battery.

18. The method of claim 17 wherein the capacity value of the transition phase model for each given voltage is a function of the two capacity values yielded by the two non-transition models for the given voltage.

19. The method of claim 17 further comprising:
    using the transition phase model to determine capacity of a battery.

20. A method comprising:

determining if a battery is in a charging state, a discharging state, or a transition phase, the transition phase occurring upon connection of the battery to a power source or disconnection of the battery from a power source, in which the battery's capacity as a function of voltage differs from both a charge curve and a discharge curve of the battery;

if the battery is in the charging state, then determining the battery's capacity through the battery's charge capacity model as a function of voltage;

if the battery is in the discharging state, then determining the battery's capacity through the battery's discharge capacity model as a function of voltage;

if the battery is in the transition phase, then determining the battery's capacity through a transition capacity model as a function of voltage.

21. The method of claim 20 further comprising:

determining that the battery has entered the transition phase based on sensing an abrupt change in the battery's voltage.

22. The method of claim 20 further comprising:

determining that the battery has entered the transition phase based on sensing a change in direction of current through the battery.

23. The method of claim 20 wherein a capacity value of the transition phase model for each given voltage is a function of the two capacity values yielded by the charge model and discharge model for the given voltage.

* * * * *